United States Patent
Wu

(10) Patent No.: US 8,223,540 B2
(45) Date of Patent: Jul. 17, 2012

(54) METHOD AND APPARATUS FOR DOUBLE-SIDED BIASING OF NONVOLATILE MEMORY

(75) Inventor: Chao-I Wu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 1178 days.

(21) Appl. No.: 11/670,677

(22) Filed: Feb. 2, 2007

(65) Prior Publication Data

US 2008/0185615 A1    Aug. 7, 2008

(51) Int. Cl.
*G11C 11/34* (2006.01)
*H01L 27/115* (2006.01)

(52) U.S. Cl. ......... 365/185.03; 365/185.18; 365/185.28; 365/185.29; 257/E21.209; 257/E29.309

(58) Field of Classification Search ........... 257/E21.209, 257/E29.309; 365/185.03, 185.18, 185.22, 365/185.28
See application file for complete search history.

(56) References Cited

U.S. PATENT DOCUMENTS

| | | | |
|---|---|---|---|
| 3,631,264 A * | 12/1971 | Morgan | 327/309 |
| 3,798,562 A * | 3/1974 | Takahashi et al. | 330/283 |
| 4,959,812 A | 9/1990 | Momodomi et al. | |
| 5,270,969 A | 12/1993 | Iwahashi et al. | |
| 5,278,439 A | 1/1994 | Ma et al. | |
| 5,355,464 A | 10/1994 | Fandrich et al. | |
| 5,408,115 A | 4/1995 | Chang | |
| 5,424,569 A | 6/1995 | Prall | |
| 5,448,517 A | 9/1995 | Iwahashi et al. | |
| 5,483,486 A | 1/1996 | Javanifard et al. | |
| 5,485,422 A | 1/1996 | Bauer et al. | |
| 5,509,134 A | 4/1996 | Fandrich et al. | |
| 5,515,324 A | 5/1996 | Tanaka et al. | |
| 5,566,120 A | 10/1996 | D'Souza | |
| 5,602,775 A | 2/1997 | Vo | |
| 5,644,533 A | 7/1997 | Lancaster et al. | |
| 5,694,356 A | 12/1997 | Wong et al. | |
| 5,745,410 A | 4/1998 | Yiu et al. | |
| 5,768,192 A | 6/1998 | Eitan | |
| RE35,838 E | 7/1998 | Momodomi et al. | |
| 5,838,618 A | 11/1998 | Lee et al. | |
| 5,856,943 A | 1/1999 | Jeng | |
| 5,895,949 A | 4/1999 | Endoh et al. | |
| 5,962,890 A | 10/1999 | Sato et al. | |
| 5,966,603 A | 10/1999 | Eitan et al. | |

(Continued)

FOREIGN PATENT DOCUMENTS

CN  1574297 A  2/2005

(Continued)

OTHER PUBLICATIONS

Ito, F., "A Novel MNOS Technology Using Gate Hole Injection in Erase Operation for Embedded Nonvolatile Memeory Application," 2004 Symposium on VLSI Technology Digest of Technical Papers, 2004 IEEE, 2 pp.

(Continued)

*Primary Examiner* — Zandra Smith
*Assistant Examiner* — Tsz Chiu
(74) *Attorney, Agent, or Firm* — Haynes Beffel & Wolfeld LLP; Kenta Suzue

(57) ABSTRACT

Methods and apparatuses are disclosed for biasing the source-side and the drain-side of a nonvolatile memory to add electrons to the charge trapping structure.

14 Claims, 7 Drawing Sheets

U.S. PATENT DOCUMENTS

| | | | |
|---|---|---|---|
| 6,011,725 | A | 1/2000 | Eitan et al |
| 6,034,896 | A | 3/2000 | Ranaweera et al. |
| 6,067,251 | A | 5/2000 | Hirano et al. |
| 6,074,917 | A | 6/2000 | Chang et al. |
| 6,096,603 | A | 8/2000 | Chang et al. |
| 6,172,907 | B1 | 1/2001 | Jenne |
| 6,194,272 | B1 | 2/2001 | Sung et al. |
| 6,215,148 | B1 | 4/2001 | Eitan et al. |
| 6,219,276 | B1 | 4/2001 | Parker |
| 6,232,631 | B1 * | 5/2001 | Schmidt et al. ............... 257/315 |
| 6,297,096 | B1 | 10/2001 | Boaz et al. |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,436,768 | B1 | 8/2002 | Yang et al. |
| 6,458,642 | B1 | 10/2002 | Yeh et al. |
| 6,487,114 | B2 | 11/2002 | Jong et al. |
| 6,512,696 | B1 | 1/2003 | Fan et al. |
| 6,538,923 | B1 | 3/2003 | Parker |
| 6,552,386 | B1 | 4/2003 | Wu et al. |
| 6,566,699 | B2 | 5/2003 | Eitan et al. |
| 6,587,903 | B2 | 7/2003 | Roohparvar |
| 6,614,070 | B1 | 9/2003 | Hirose et al. |
| 6,614,694 | B1 | 9/2003 | Yeh et al. |
| 6,643,181 | B2 | 11/2003 | Sofer et al. |
| 6,643,185 | B1 | 11/2003 | Wang et al. |
| 6,646,924 | B1 | 11/2003 | Tsai et al. |
| 6,657,894 | B2 * | 12/2003 | Yeh et al. ................. 365/185.16 |
| 6,670,240 | B2 | 12/2003 | Ogura et al. |
| 6,670,671 | B2 | 12/2003 | Sasago et al. |
| 6,690,601 | B2 | 2/2004 | Yeh et al. |
| 6,714,457 | B1 | 3/2004 | Hsu et al. |
| 6,721,204 | B1 | 4/2004 | Yeh et al. |
| 6,744,675 | B1 * | 6/2004 | Zheng et al. ............. 365/185.28 |
| 6,834,012 | B1 | 12/2004 | He et al. |
| 6,836,435 | B2 | 12/2004 | Li |
| 6,912,163 | B2 | 6/2005 | Zheng et al. |
| 6,937,511 | B2 | 8/2005 | Hsu et al. |
| 7,016,225 | B2 | 3/2006 | Roizin et al. |
| 7,075,143 | B2 | 7/2006 | Fujiwara et al. |
| 7,075,828 | B2 | 7/2006 | Lue et al. |
| 7,092,298 | B2 | 8/2006 | Kim et al. |
| 7,209,390 | B2 * | 4/2007 | Lue et al. ................. 365/185.19 |
| 7,492,636 | B2 * | 2/2009 | Wu .......................... 365/185.17 |
| 7,548,458 | B2 * | 6/2009 | Wu .......................... 365/185.03 |
| 7,561,470 | B2 * | 7/2009 | Wu .......................... 365/185.18 |
| 7,652,929 | B2 * | 1/2010 | Li ............................ 365/185.24 |
| 7,894,269 | B2 * | 2/2011 | Li ............................ 365/185.22 |
| 2001/0002052 | A1 * | 5/2001 | Guo et al. ................ 365/185.28 |
| 2002/0167844 | A1 | 11/2002 | Han et al. |
| 2002/0179958 | A1 | 12/2002 | Kim |
| 2003/0036250 | A1 | 2/2003 | Lin et al. |
| 2003/0185055 | A1 | 10/2003 | Yeh et al. |
| 2004/0084714 | A1 | 5/2004 | Ishii et al. |
| 2004/0145024 | A1 | 7/2004 | Chen et al. |
| 2005/0001258 | A1 | 1/2005 | Forbes |
| 2006/0007732 | A1 | 1/2006 | Yeh |

FOREIGN PATENT DOCUMENTS

| | | |
|---|---|---|
| JP | 09162313 | 6/1997 |
| JP | 11233653 | 8/1999 |
| WO | 9428551 A1 | 12/1994 |

OTHER PUBLICATIONS

Yeh, C.C., et al., "PHINES: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

U.S. Appl. No. 11/614,742 entitled "Double-Side-Bias Methods of Programming and Erasing a Virtual Ground Array Memory," filed Dec. 21, 2006, 16 pp.

Tsai, Wen Jer et al., Taiwan Patent Application No. 91120417, filed on Sep. 9, 2002 (TW counterpart to U.S. Appl. No. 10/289,866 below), 24pages.

Tsai, Wen Jer et al., U.S. Appl. No. 10/289,866, filed Nov. 6, 2002, entitled "Erasing Method for Non-Volatile Memory," 24 pages.

Bude, J.D., et al. "Secondary Electron Flash—a High Performance, Low Power Flash Technology for 0.35 .cndot.m and Below," Electron Devices Meeting, 1997. Technical Digest., International , Dec. 7-10, 1997, 279-282.

Chung, Steve S., "Low Voltage/Power and High Speed Flash Memory Technology for High Performance and Reliability," the 3rd WIMNACT—Singapore, Oct. 15, 2003, 1-48.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp. 26.6.1-26.6.4.

De Blauwe, Jan, "Nanocrystal Nonvolatile Memory Devices," IEEE Transactions on Nanotechnology, vol. 1, No. 1, Mar. 2002, 72-77.

Eitan, Boaz, et al. "NROM: A Novel Localized Trapping, 2-Bit Nonvolatile Memory Cell," IEEE Electron Device Letters, vol. 21, No. 11, Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International , Nov. 6-8, 2002, p. 2-3.

Janai, Meir, "Data Retention, Endurance and Acceleration Factors of NROM Devices," IEEE 41st Annual International Reliability Physics Symposium, Dallas, Texas, 2003, 502-505.

Lee, Chang Hyun, et al. "A Novel SONOS Structure of SiO2/SiN/Al2O3 with TaN Metal Gate for Multi-Giga Bit Flash Memeries," Electron Devices Meeting, 2003. IEDM '03 Technical Digest. IEEE International , Dec. 8-10, 2003, 26.5.1-26.5.4.

Lee, Changhyun, et al., "A Novel Structure of SiO2/SiN/High k Dielectrics, Al2O3 for SONOS Type Flash Memory," Extended Abstracts of the 2002 International Conference on Solid State Devices and Materials, Sep. 17-19, 2002, Nagoya, 162-163.

Lee, Jae-Duk, et al., "Effects of Floating-Gate Interference on NAND Flash Memory Cell Operation," IEEE Electron Device Letters, vol. 23, No. 5, May 2002, 264-266.

Liu, Zhizheng et al., "A New Programming Technique for Flash Memory Devices," International Symposium on VLSI Technology, Systems and Applications, Jun. 8-10, 1999, 195-198.

Huff, H.R. and Bevan, M., assemblers, "Questions at the International Workshop on Gate Insulators," Ad Hoc Meeting on High-k Gate Dielectrics at the Semiconductor Interface Specialists Conference, Nov. 30, 2001, 3 pages.

Shin, Yoocheol, et al., "High Reliable SONOS-type NAND Flash Memory Cell with Al2O3 for Top Oxide," Non-Volatile Semiconductor Memory Workshop, 2003, 2 pages.

Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp. 32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp. 7.4.1-7.4.4.

White, Marvin, H., et al., "On the Go with SONOS," Circuits and Devices Magazine, IEEE , vol. 16 , Issue: 4 , Jul. 2000, pp. 22-31.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International , Dec. 8-10, 2003, pp. 7.5.1-7.5.4.

Yeh, C.C., et al., "PHINES: A Novel Low Power Program/Erase, Small Pitch, 2-Bit per Cell Flash Memory," Electron Devices Meeting, 2002. IEDM '02. Digest. International , Dec. 8-11, 2002, pp. 931-934.

Chang, Kuo-Tung, et al., "A New SONOS Memory Using Source-Side Injection for Programming," IEEE Electron Device Letters, vol. 19, No. 7, Jul. 1998, 253-255.

Eitan, Boaz, "Can NROM, a 2-bit, Trapping Storage NVM Cell, Give a Real Challenge to Floating Gate Cells?" SSDM, Tokyo, Japan (1999), 3 pages.

Fujiwara, I., et al., "0.13 .mu.m MONOS single transistor memory cell with separated source lines," IEDM 1998, 995-998.

Kobayashi, T., et al., A Giga-Scale Assist-Gate (AG)-AND-Type Flash Memory Cell with 20-MB/s Programming Throughput for Content-Downloading Applications, IEDM 2001, 2.2.1-2.2.4.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Naruke, K., et al. "A new Flash-Erase EEPROM Cell with a Sidewall Select-Gate on its Source Side, Nonvolatile Semiconductor Memories: Technologies, design and application," C. Hu. Ed., New York, IEEE Press, 1991, Ch. 5, pp. 183-186.

Sasago, Y, et al., "90-nm-node multi-level AG-AND type flash memory with cell size of true 2 F2/bit and programming throughput of 10 MB/s," IEEE, 2003, 4 pages.

U.S. Appl. No. 10/855,286, filed May 26, 2004, entitled "Nand-Type Non-Volatile Memory Cell and Method for Operating Same," 15 pages.

Lawri, S. K., "MNOS/Floating-Gate Charge Coupled Devices for High Density EEPROMS: A New Concept", Physics of Semiconductor Devices, Dec. 1997, pp. 951-956, vol. 3316, No. 2.

E.J.E.J. Prinz et al. "An Embedded 90nm SONOS Flash EEPROM Utilizing Hot Electron Injection Programming and 2-Sided Hot Hole Injection Erase," NVM Workshop 2003, 2 pages.

\* cited by examiner

METHOD AND APPARATUS FOR DOUBLE-SIDED BIASING OF NONVOLATILE MEMORY

BACKGROUND OF THE INVENTION

1. Field of the Invention

The technology is related to nonvolatile memory, and in particular to performing operations on the nonvolatile memory of adding electrons.

2. Description of Related Art

Fowler-Nordheim tunneling is a known charge transport mechanism to move electrons from the source and drain of a nonvolatile memory cell to the charge trapping structure. However, because Fowler-Nordheim tunneling requires a relatively large electric field Fowler-Nordheim tunneling requires large voltage differences between the gate, and the source, drain, and body. Therefore, it would be desirable to move electrons from the source and drain of a nonvolatile memory cell to the charge trapping structure, without requiring such a large electric field and large voltages.

SUMMARY OF THE INVENTION

One aspect of the technology is a method of operating a nonvolatile memory cell having a charge trapping structure to store charge and voltage terminals including a gate region, source and drain regions, and a body region, comprising the following steps:

The step of, in response to an instruction to add electrons to the charge trapping structure, applying a bias arrangement to the voltage terminals, such that the bias arrangement includes positively biasing the source and drain regions relative to the body region and the bias arrangement includes positively biasing the gate region relative to the source and drain regions.

In some embodiments, positively biasing the source and drain regions relative to the body region causes holes to flow from the source and drain regions to the body region. The bias arrangement positively biases the source and drain regions relative to the body region by no more than about 6 V.

In some embodiments, positively biasing the gate region relative to the source and drain regions causes electrons to flow from the body region to the charge trapping structure. In some embodiments, these electrons are generated in the body region. The bias arrangement positively biases the gate region relative to the source and drain regions by no more than about 11 V.

In some embodiments, the bias arrangement includes biasing the source and drain regions with a same voltage; and grounding the body region.

Some embodiments emulate Fowler-Nordheim operations, and the bias arrangement has at least one lower magnitude voltage than a comparable Fowler-Nordheim operation.

In some embodiments, in response to an instruction to add holes to the charge trapping structure, a second bias arrangement is applied to the voltage terminals, such that the second bias arrangement includes positively biasing the source and drain regions relative to the body region and the bias arrangement includes negatively biasing the gate region relative to the source, drain, and body regions.

Another aspect of the technology is an integrated circuit with nonvolatile memory and control circuitry that performs biasing as described herein.

BRIEF DESCRIPTION OF THE DRAWINGS

FIGS. 4A-4C show an example flow of programming and erasing a nonvolatile memory cell, including adding electrons to both the source-side and drain-side of the charge trapping structure of a nonvolatile memory cell in FIG. 4A, followed by selectively adding holes to the source-side of the charge trapping structure in FIG. 4B, and further followed by selectively adding holes to the drain-side of the charge trapping structure in FIG. 4C.

DETAILED DESCRIPTION

Figure 1:
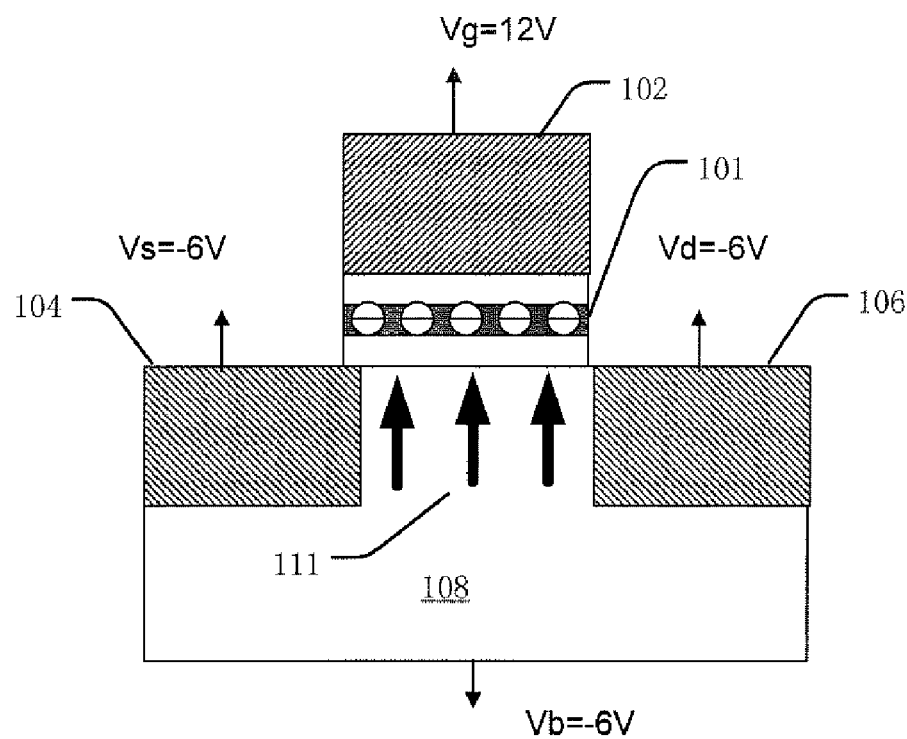
FIG. 1 is a simplified prior art diagram of a nonvolatile memory cell which adds electrons to the charge trapping structure of the nonvolatile memory cell via Fowler-Nordheim tunneling and its associated high voltage difference 1) between the gate region and the source and drain regions, and 2) between the gate region and the body region.

FIG. 1 is a simplified prior art diagram of a nonvolatile memory cell which adds electrons to the charge trapping structure of the nonvolatile memory cell via Fowler-Nordheim tunneling and its associated high voltage difference 1) between the gate region and the source and drain regions, and 2) between the gate region and the body region.

The charge trapping memory cell of FIG. 1 has a p-doped body region 108 and n+-doped source region 104 and drain region 106. The remainder of the memory cell includes a stack 101 including a bottom dielectric structure (bottom oxide) on the body region 108, a charge trapping structure on the bottom dielectric structure, and a top dielectric structure (top oxide) on the charge trapping structure. A gate 102 is on the stack 101. Representative top dielectrics include silicon dioxide and silicon oxynitride having a thickness of about 5 to 10 nanometers, or other similar high dielectric constant materials, for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for SONOS cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In older memory cells, the material of a floating gate is an equipotential or nearly equipotential structure, such as highly doped polysilicon. Thus, charge that is added to the floating gate will tend to spread out evenly throughout the floating gate. If charge is added to the floating gate with the goal of raising the charge density of one portion of the floating gate, then because of the equipotential nature of the floating gate, typically sufficient charge must be added to the floating gate until the charge density of the entire floating gate is raised.

In contrast with a floating gate, a charge trapping structure may be approximated as neither an equipotential nor nearly equipotential structure. When charge is added to the charge trapping structure, the added charge remains local to a portion of the charge trapping structure, rather than automatically spreading evenly throughout the charge trapping structure. Thus, when charge is added to the charge trapping structure with the goal of raising the charge density of one portion of the floating gate, the charge density of part of the charge trapping structure rises, while the charge density of the remainder of the charge trapping structure remains relatively unchanged. The requirement of the amount of added charge is much less for the charge trapping structure than for a comparable floating gate.

The bias arrangement of the memory cell of FIG. 1 is a gate voltage Vg of 12 V, a source voltage Vs of −6 V, a drain voltage Vd of −6 V, and a body voltage Vb of −6 V. Under these conditions with a relatively large voltage difference between the gate region, and the source region, drain region, and body region, Fowler-Nordheim tunneling of electrons occurs, as shown by the arrows 111, such that electrons move from the source region 104 and the drain region 106 to the charge trapping structure.

Figure 2:
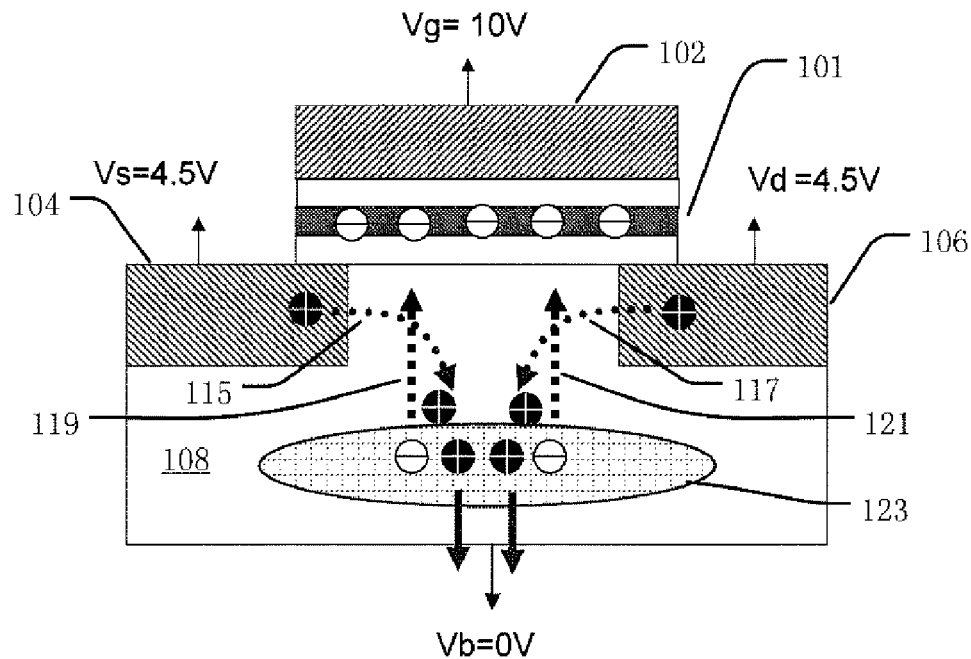
FIG. 2 is a simplified diagram of a Double-Side-Bias (DSB) programmed nonvolatile memory cell which adds electrons to the charge trapping structure of the nonvolatile memory cell via hot-hole impact ionization which generates the electrons, and its associated low voltage difference 1) between the gate region and the source and drain regions, and 2) between the gate region and the body region. Also, no substrate bias is applied, simplifying memory design.

FIG. 2 is a simplified diagram of a nonvolatile memory cell which adds electrons to the charge trapping structure of the nonvolatile memory cell via hot hole impact ionization which generates the electrons, and its associated low voltage difference 1) between the gate region and the source and drain regions, and 2) between the gate region and the body region. (Double-Side-Bias (DSB) program)

The bias arrangement of the memory cell of FIG. 2 is a gate voltage Vg of 10 V, a source voltage Vs of 4.5 V, a drain voltage Vd of 4.5 V, and a body voltage Vb of 0 V. Under these conditions with a relatively small voltage difference between the gate region, and the source region, drain region, and body region, hot holes move from the source region 104 and the drain region 106 into the body region 108, as shown by the hole movements 115 and 117. These hot holes cause impact ionization 123 in the body region 108, resulting in hot electrons. These hot electrons move from the body region to the charge trapping structure, as shown by the arrows 119 and 121. Thus, this bias arrangement emulates the Fowler-Nordheim arrangement of FIG. 1, but requires at least one lower magnitude voltage.

Figure 3:
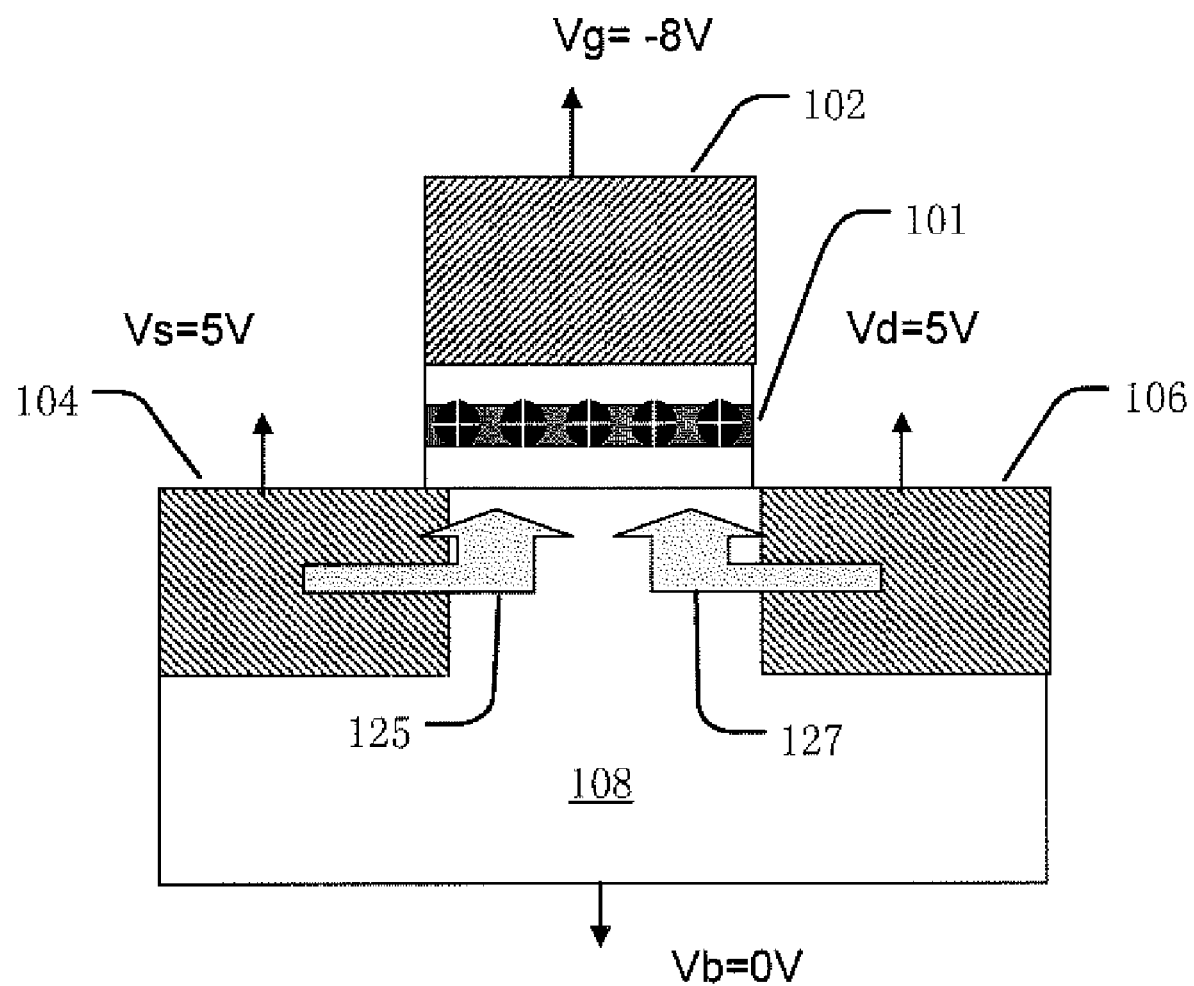
FIG. 3 is a simplified diagram of a Double-Side-Bias (DSB) erased nonvolatile memory cell which adds holes to the charge trapping structure of the nonvolatile memory cell via simultaneous two-sided band-to-band hot holes.

FIG. 3 is a simplified diagram of a nonvolatile memory cell which simultaneously adds holes to the source-side and drain-side of the charge trapping structure of the nonvolatile memory cell via band-to-band hot holes. (Double-Side-Bias (DSB) erase)

The bias arrangement of the memory cell of FIG. 3 is a gate voltage Vg of −8 V, a source voltage Vs of 5 V, a drain voltage Vd of 5 V, and a body voltage Vb of 0 V. Under these conditions with a relatively large voltage difference between the gate region, and the source region, drain region, and body region, band-to-band hot hole movement occurs, as shown by the arrows 125 and 127, such that holes move from the source region 104 and the drain region 106 to the charge trapping structure.

FIGS. 4A-4C show an example flow of programming and erasing a nonvolatile memory cell, including adding electrons to both the source-side and drain-side of the charge trapping structure of a nonvolatile memory cell in FIG. 4A, followed by selectively adding holes to the source-side of the charge trapping structure in FIG. 4B, and further followed by selectively adding holes to the drain-side of the charge trapping structure in FIG. 4C.

Figure 5:
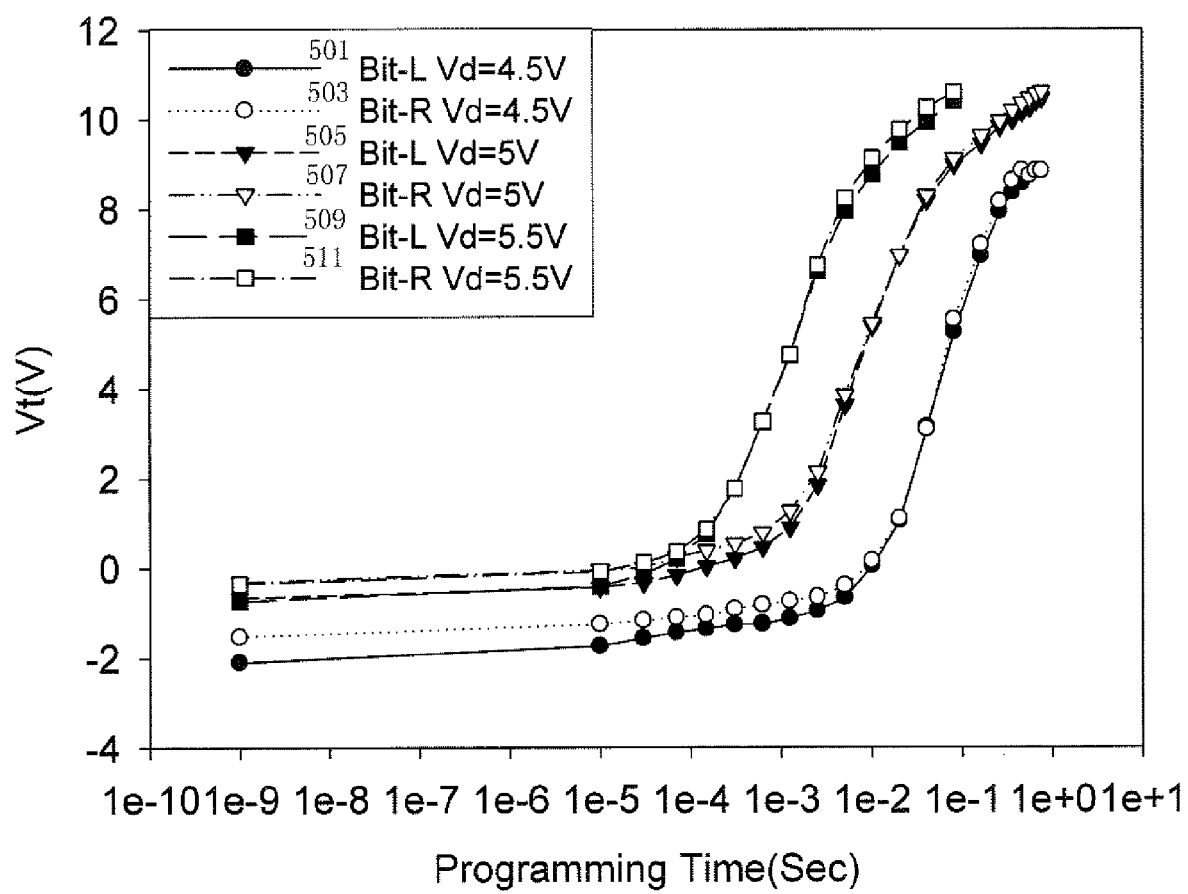
FIG. 5 is a Double-Side-Bias (DSB) program graph of threshold voltage versus programming time for the right and left portions of a charge trapping structure of a nonvolatile memory cell, under three different biasing conditions of the drain voltage and source voltage.

FIG. 5 is a graph of threshold voltage versus programming time for the right and left portions of a charge trapping structure of a nonvolatile memory cell, under three different biasing conditions of the drain voltage and source voltage. The gate voltage Vg is 10 V. The graph shows that, as the source/drain voltage increases, the programming time shortens. The larger source/drain voltage generates more hot holes and induces more electrons which result from impact ionization.

| Reference Number | Portion of Charge Trapping Structure | Voltage of Source/Drain |
|---|---|---|
| 501 | Left | 4.5 V |
| 503 | Right | 4.5 V |
| 505 | Left | 5 V |
| 507 | Right | 5 V |
| 509 | Left | 5.5 V |
| 511 | Right | 5.5 V |

In other embodiments, the gate voltage Vg ranges between 5-15 V, the source and drain voltages Vd and Vs range between 4-6V, and the body voltage Vb is 0 V. The pulse width ranges between 100 us to 100 ms.

Figure 6:
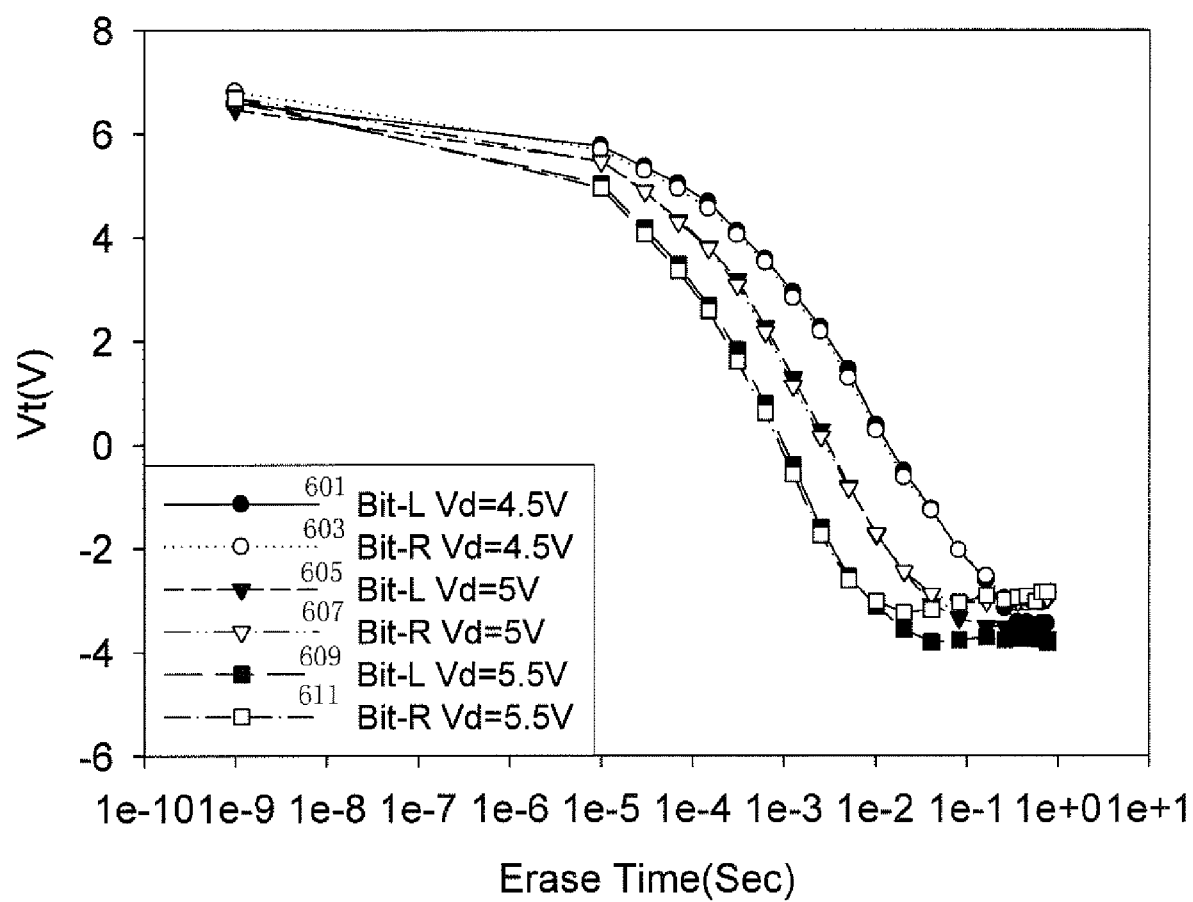
FIG. 6 is a Double-Side-Bias (DSB) erase graph of threshold voltage versus erasing time for the right and left portions of a charge trapping structure of a nonvolatile memory cell, under three different biasing conditions of the drain voltage and source voltage.

FIG. 6 is a graph of threshold voltage versus erasing time for the right and left portions of a charge trapping structure of a nonvolatile memory cell, under three different biasing conditions of the drain voltage and source voltage. The gate voltage Vg is −10 V and the gate length Lg is 0.16 microns.

| Reference Number | Portion of Charge Trapping Structure | Voltage of Source/Drain |
|---|---|---|
| 601 | Left | 4.5 V |
| 603 | Right | 4.5 V |
| 605 | Left | 5 V |
| 607 | Right | 5 V |
| 609 | Left | 5.5 V |
| 611 | Right | 5.5 V |

In other embodiments the gate voltage Vg ranges between −5 V to −15 V, the source and drain voltages Vd and Vs range between 4-6V, and the body voltage Vb is 0 V. The pulse width ranges between 100 us to 100 ms.

Figure 7:
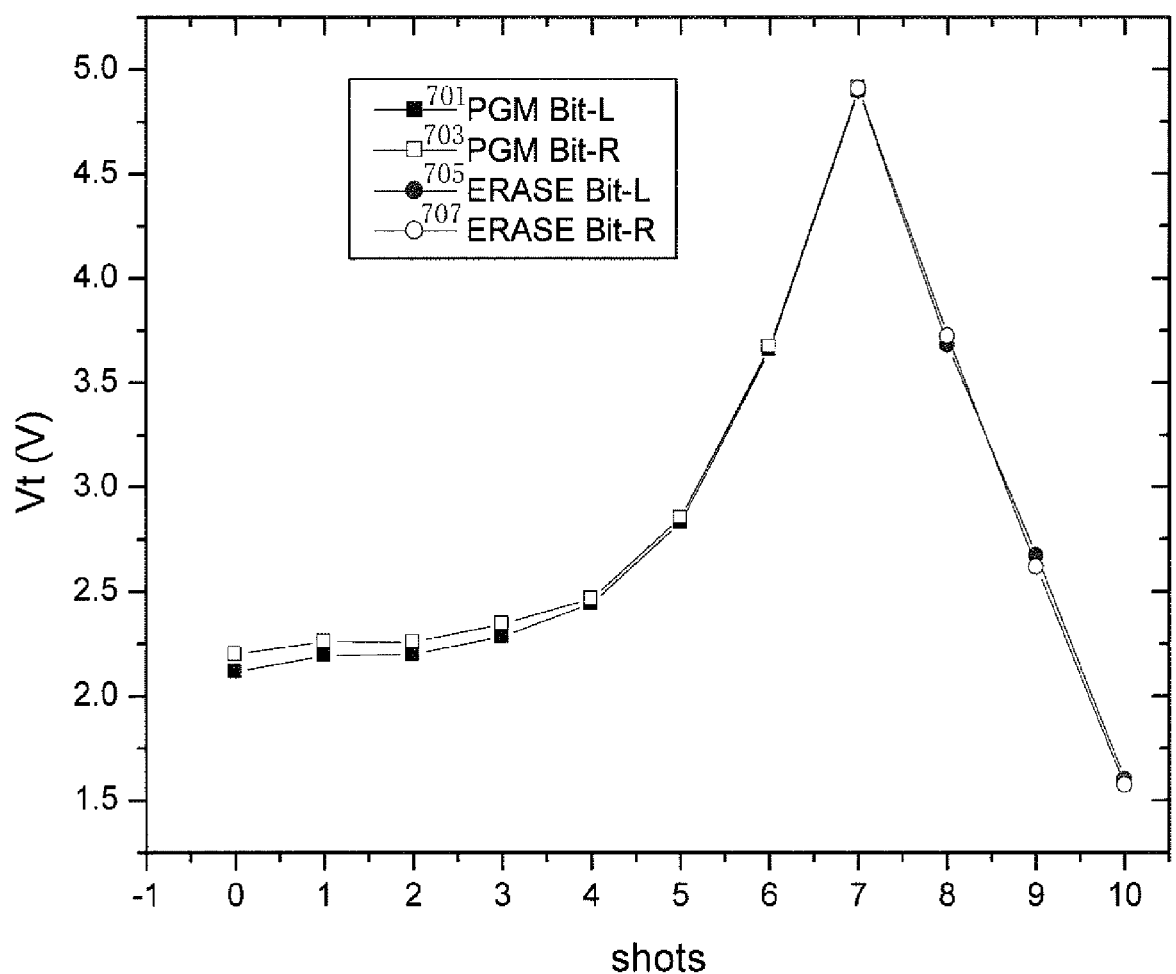
FIG. 7 is a Double-Side-Bias (DSB) operation graph of threshold voltage versus erase or program shot for the right and left portions of a charge trapping structure of a nonvolatile memory cell.

FIG. 7 is a graph of threshold voltage versus erase or program shot for the right and left portions of a charge trapping structure of a nonvolatile memory cell.

| Reference Number | Portion of Charge Trapping Structure | Operation |
|---|---|---|
| 701 | Left | PGM |
| 703 | Right | PGM |
| 705 | Left | ERASE |
| 707 | Right | ERASE |

Figure 8:
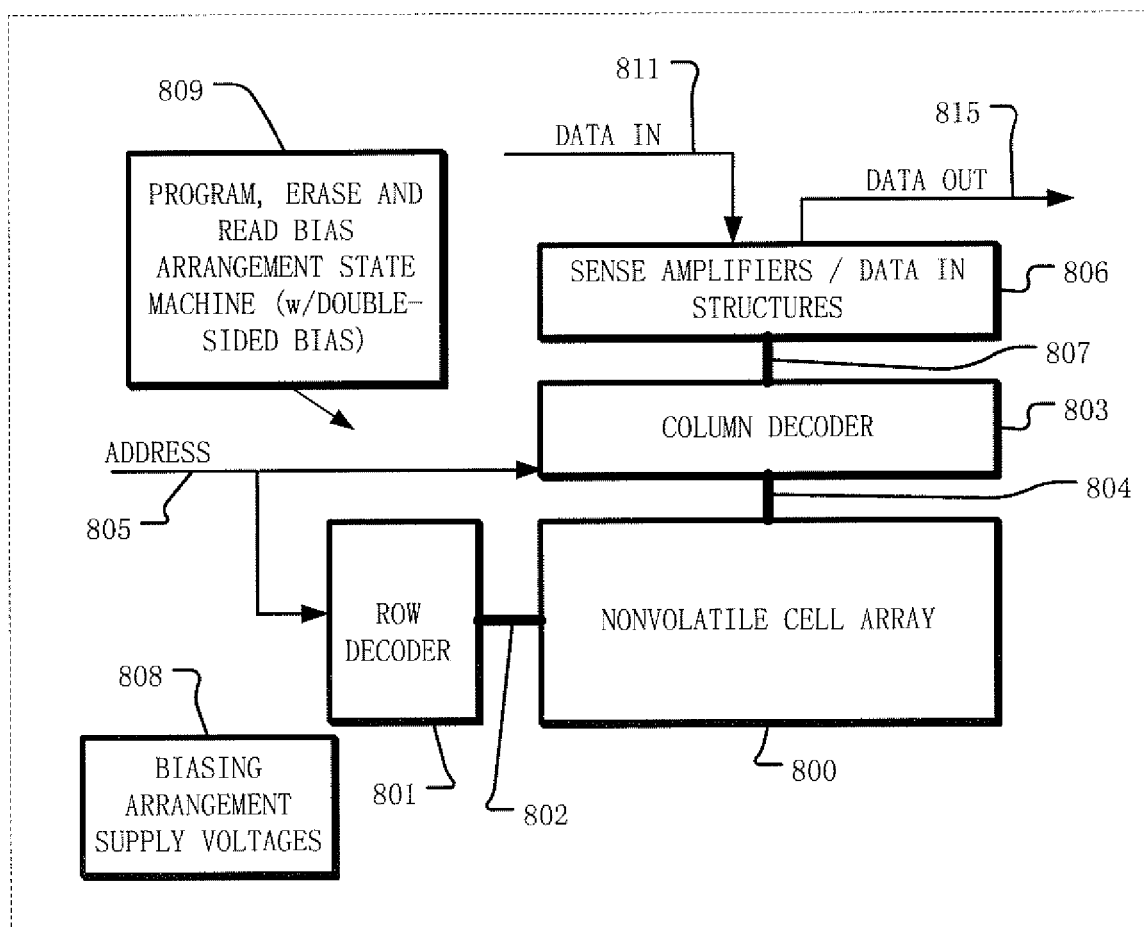
FIG. 8 is a simplified diagram of an integrated circuit embodiment which adds electrons to the charge trapping structure of the nonvolatile memory cell via hot hole impact ionization which generates the electrons.

FIG. 8 is a simplified diagram of an integrated circuit embodiment which adds electrons to the charge trapping structure of the nonvolatile memory cell via hot hole impact ionization which generates the electrons. The integrated circuit 850 includes a memory array 800 implemented using charge trapping memory cells, on a semiconductor substrate. A row decoder 801 is coupled to a plurality of word lines 802 arranged along rows in the memory array 800. A column decoder 803 is coupled to a plurality of bit lines 804 arranged along columns in the memory array 800. Addresses are supplied on bus 805 to column decoder 803 and row decoder 801. Sense amplifiers and data-in structures in block 806 are coupled to the column decoder 803 via data bus 807. Data is supplied via the data-in line 811 from input/output ports on the integrated circuit 850, or from other data sources internal or external to the integrated circuit 850, to the data-in structures in block 806. Data is supplied via the data out line 815 from the sense amplifiers in block 806 to input/output ports on the integrated circuit 850, or to other data destinations internal or external to the integrated circuit 850. A bias arrangement state machine 809 controls the application of bias arrangement supply voltages 808, and also applies double-sided bias arrangements as disclosed herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   a nonvolatile memory cell including:
      a charge trapping structure to store charge; and
      voltage terminals including a gate region, source and drain regions, and a body region;
   control circuitry coupled to the nonvolatile memory cell, the control circuitry applying a bias arrangement to the voltage terminals in response to an instruction to add electrons to the charge trapping structure, such that the bias arrangement includes continuously positively biasing, at a same time, both the source and drain regions relative to the body region and the bias arrangement includes positively biasing the gate region relative to the source and drain regions.

2. The circuit of claim 1, wherein said positively biasing the source and drain regions relative to the body region causes holes to flow from the source and drain regions to the body region.

3. The circuit of claim 1, wherein said positively biasing the gate region relative to the source and drain regions causes electrons to flow from the body region to the charge trapping structure.

4. The circuit of claim 1, wherein said positively biasing the gate region relative to the source and drain regions causes electrons generated in the body region to flow from the body region to the charge trapping structure.

5. The circuit of claim 1, wherein said positively biasing the source and drain regions relative to the body region causes holes to flow from the source and drain regions to the body region, and electrons generated in the body region to flow from the body region to the charge trapping structure.

6. The circuit of claim 1, wherein said positively biasing the source and drain regions relative to the body region causes holes to flow from the source and drain regions to the body region, and electrons generated in the body region to flow from the body region to the charge trapping structure.

7. The circuit of claim 1, wherein the bias arrangement includes positively biasing the source and drain regions relative to the body region by no more than about 6 V.

8. The circuit of claim 1, wherein the bias arrangement includes positively biasing the gate region relative to the source and drain regions by no more than about 11 V.

9. The circuit of claim 1, wherein the bias arrangement includes positively biasing the source and drain regions relative to the body region by no more than about 6 V and the bias arrangement includes positively biasing the gate region relative to the source and drain regions by no more than about 11 V.

10. The circuit of claim 1, wherein the bias arrangement biases the source and drain regions with a same voltage; and grounds the body region.

11. The circuit of claim 1, wherein the bias arrangement emulates Fowler-Nordheim operations and the bias arrangement has at least one lower magnitude voltage than a comparable Fowler-Nordheim operation.

12. The circuit of claim 1, wherein the control circuitry applies a second bias arrangement to the voltage terminals in response to an instruction to add holes to the charge trapping structure, such that the second bias arrangement includes positively biasing the source and drain regions relative to the body region and the bias arrangement includes negatively biasing the gate region relative to the source, drain, and body regions.

13. An integrated circuit, comprising:
   a nonvolatile memory cell including:
      a charge trapping structure to store charge; and
      voltage terminals including a gate region, source and drain regions, and a body region;
   control circuitry coupled to the nonvolatile memory cell, the control circuitry applying a bias arrangement to the voltage terminals in response to an instruction to add electrons to the charge trapping structure, such that the bias arrangement consists of: (i) continuously positively biasing, at a same time, both the source and drain regions relative to the body region and (ii) positively biasing the gate region relative to the source and drain regions.

14. An integrated circuit, comprising:
a nonvolatile memory cell including:
   a charge trapping structure to store charge; and
   voltage terminals including a gate region, source and drain regions, and a body region adjacent to the source and drain regions;
control circuitry coupled to the nonvolatile memory cell, the control circuitry applying a bias arrangement to the voltage terminals in response to an instruction to add electrons to the charge trapping structure, such that charge movement in response to the instruction originates from only any of the source and drain regions and the body region, and such that the bias arrangement includes continuously positively biasing, at a same time, both the source and drain regions relative to the body region and the bias arrangement includes positively biasing the gate region relative to the source and drain regions.

\* \* \* \* \*